United States Patent
Yeh et al.

(10) Patent No.: US 8,110,490 B2
(45) Date of Patent: Feb. 7, 2012

(54) GATE OXIDE LEAKAGE REDUCTION

(75) Inventors: Matt Yeh, Hsinchun (TW); Da-Yuan Lee, Kaohsiung (TW); Chi-Chun Chen, Kaohsiung (TW); Hun-Jan Tao, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 385 days.

(21) Appl. No.: 11/839,399

(22) Filed: Aug. 15, 2007

(65) Prior Publication Data

US 2009/0047799 A1    Feb. 19, 2009

(51) Int. Cl.
*H01L 21/8238*    (2006.01)
*H01L 21/336*    (2006.01)
*H01L 21/3205*    (2006.01)
*H01L 21/4763*    (2006.01)

(52) U.S. Cl. ........ 438/591; 438/216; 438/261; 438/287; 257/411; 257/E21.247; 257/E21.267; 257/E21.268; 257/E21.269; 257/E21.302

(58) Field of Classification Search .................. 438/585, 438/216, 261, 287, 591; 257/410, 411
See application file for complete search history.

(56) References Cited

U.S. PATENT DOCUMENTS

| | | | |
|---|---|---|---|
| 6,180,543 B1 | 1/2001 | Yu et al. | |
| 6,197,701 B1 | 3/2001 | Shue et al. | |
| 6,534,395 B2 | 3/2003 | Werkhoven et al. | |
| 6,610,615 B1 | 8/2003 | McFadden et al. | |
| 6,649,538 B1 | 11/2003 | Cheng et al. | |
| 6,667,251 B2 | 12/2003 | McFadden et al. | |
| 6,737,362 B1 | 5/2004 | Chen et al. | |
| 7,144,825 B2 | 12/2006 | Adetutu et al. | |
| 7,179,754 B2 | 2/2007 | Kraus et al. | |
| 2004/0232499 A1* | 11/2004 | Ryoo | 257/410 |
| 2005/0164444 A1* | 7/2005 | Burnham et al. | 438/232 |
| 2005/0260357 A1* | 11/2005 | Olsen et al. | 427/569 |
| 2006/0194423 A1* | 8/2006 | Lim et al. | 438/591 |
| 2006/0281265 A1 | 12/2006 | Burnham et al. | |
| 2007/0049043 A1 | 3/2007 | Muthukrishnan et al. | |

* cited by examiner

*Primary Examiner* — David Zarneke
(74) *Attorney, Agent, or Firm* — Haynes and Boone, LLP

(57) ABSTRACT

A method of manufacturing a semiconductor device comprising forming a gate oxide layer over a substrate subjecting the gate oxide layer to a first nitridation process, subjecting the gate oxide layer to a first anneal process after the first nitridation process, subjecting the gate oxide layer to a second nitridation process after the first anneal process, subjecting the gate oxide layer to a second anneal process after the second nitridation process, and forming a gate electrode over the gate oxide.

23 Claims, 3 Drawing Sheets

GATE OXIDE LEAKAGE REDUCTION

BACKGROUND

Thermal growth of silicon dioxide film plays many key roles in the production and manufacture of IC semiconductor devices, and one of the most critical applications is serving as the MOSFET gate dielectric layer. When CMOS devices are scaled to gate lengths below 100 nm, they will require gate oxide equivalent thicknesses (EOT) of less than 2.0 nm. However, because direct tunneling current increases exponentially with decreasing thickness, it may not be feasible to use a pure silicon dioxide film with a thickness smaller than 2.0 nm. That is, it appears that a pure silicon dioxide film may not be suitable as a gate dielectric layer in sub-100 nm CMOS devices.

Several approaches have been suggested for resolving this issue, such as utilizing an oxynitride film instead of conventional silicon dioxide dielectric film. Current methods to prepare oxynitride include thermal nitridation and plasma nitridation, but both such methods have inherent limitations and constraints. For example, thinner oxynitride films can suffer from higher gate leakage. Constructing an ultra-thin gate oxide with sufficiently low leakage for advanced CMOS application is, thus, problematic, and is currently a critical issue.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
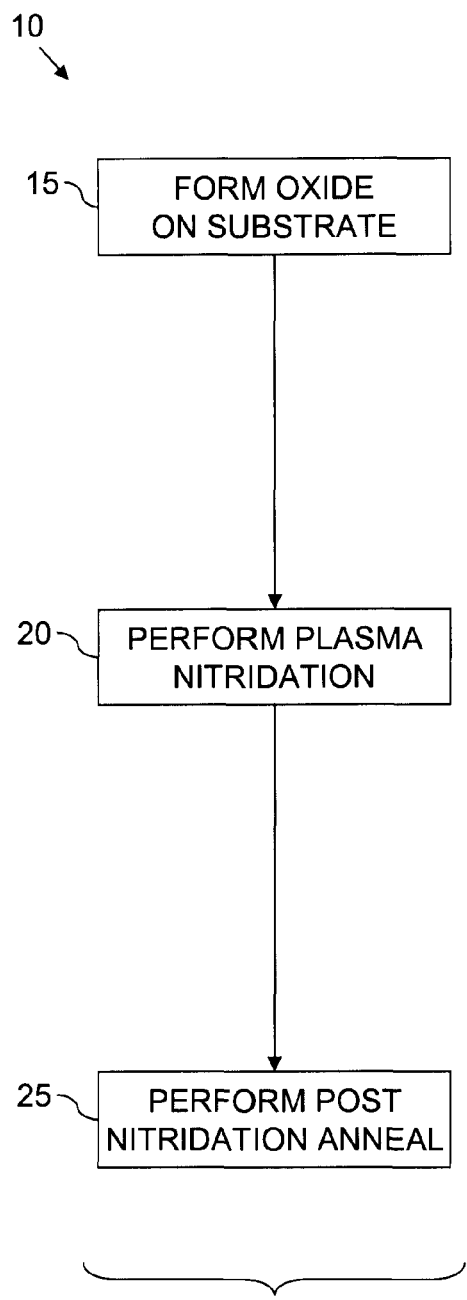
FIG. 1A is a flow-chart diagram of a conventional gate oxide manufacturing method.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1B:
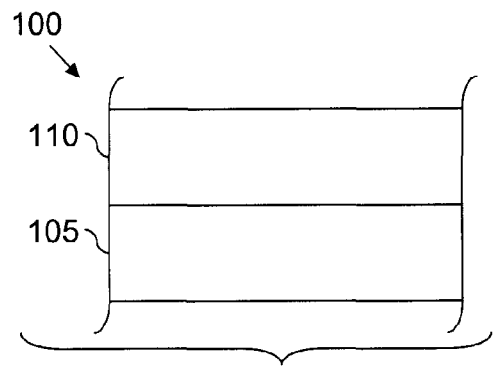
FIGS. 1B-1D are sectional views of an apparatus during various stages of manufacture according to the method shown in FIG. 1A.

FIG. 1A is a flow-chart diagram of a conventional method 10 for forming a gate dielectric. The method 10 includes a step 15 during which an oxide layer is formed on a substrate. FIG. 1B is sectional view of a portion of a conventional semiconductor apparatus 100 after the manufacturing stage depicted in step 15 of the method 10 of FIG. 1A. As shown in FIG. 1B, the oxide layer 110 formed on the substrate 105 is substantially homogeneous, substantially comprising oxide and having little or no nitrogen content.

Figure 1C:
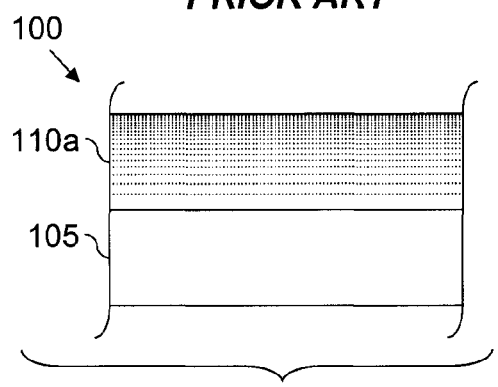

The method 10 depicted in FIG. 1A also includes a step 20 during which the oxide layer 110 is subjected to a plasma nitridation process. FIG. 1C is a sectional view of the apparatus 100 after the manufacturing stage depicted in step 20 of the method 10 of FIG. 1A. The plasma nitridation performed during step 20 of the method 10 results in a nitrided oxide layer 110a. As shown in FIG. 1C, the nitrogen is substantially concentrated near the exposed surface of the layer 110a, opposite the interface between the layer 110a and the substrate 105.

Figure 1D:
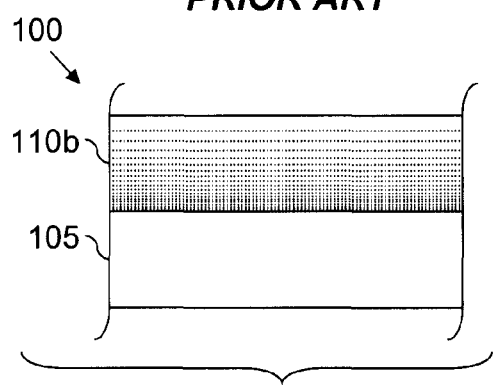

The method 10 depicted in FIG. 1A also includes a step 25 during which the nitrided oxide layer 110a is subjected to a post-nitridation anneal process. FIG. 1D is a sectional view of the apparatus 100 after the manufacturing stage depicted in step 25 of the method 10 of FIG. 1A. The post-nitridation anneal performed during step 25 of the method 10 results in a nitrided oxide layer 110b in which, as shown in FIG. 1D, the nitrogen is substantially concentrated near the interface between the layer 110b and the substrate 105. That is, the post-nitridation anneal process performed during step 25 of the method 10 drives the nitrogen content of the oxide layer away from the exposed surface of the oxide layer.

However, as described above, as the conventional process depicted in FIGS. 1A-1D is employed to form gate oxide layers of decreasing thickness, the nitrogen profile depicted in FIG. 1D does not allow for sufficiently low leakage. Consequently, threshold voltage can be less than satisfactory, device performance can be diminished, and device reliability can suffer. Moreover, uniformity of such conventional nitrided oxide film can be very difficult to control and, consequently, adversely affect product reliability and yield.

Figure 2A:
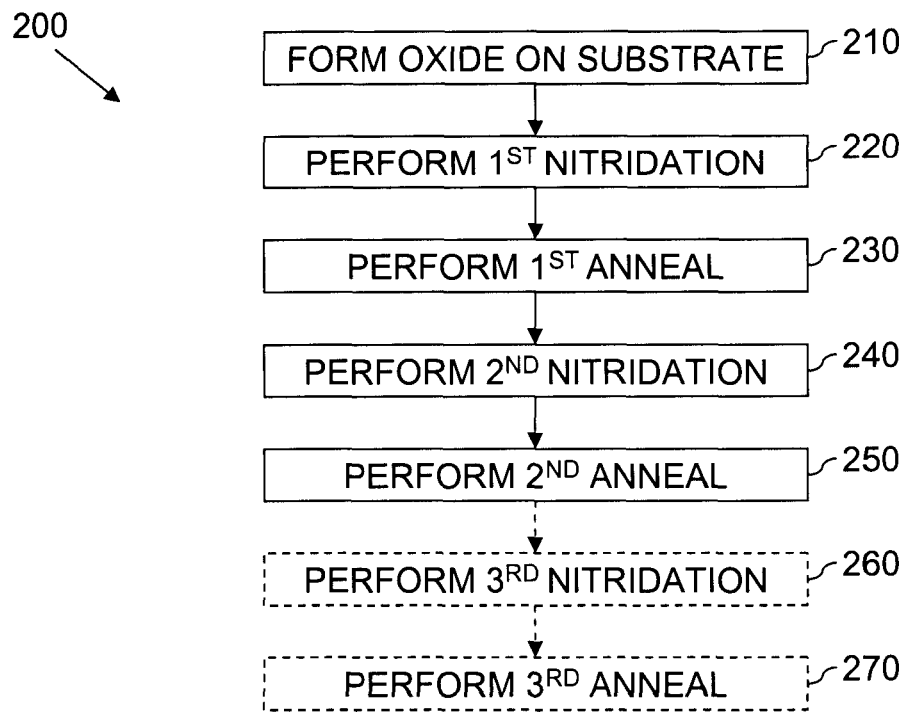
FIG. 2A is a flow-chart diagram of at least a portion of a method of manufacturing a gate oxide according to one or more aspects of the present disclosure.
Figure 2B:
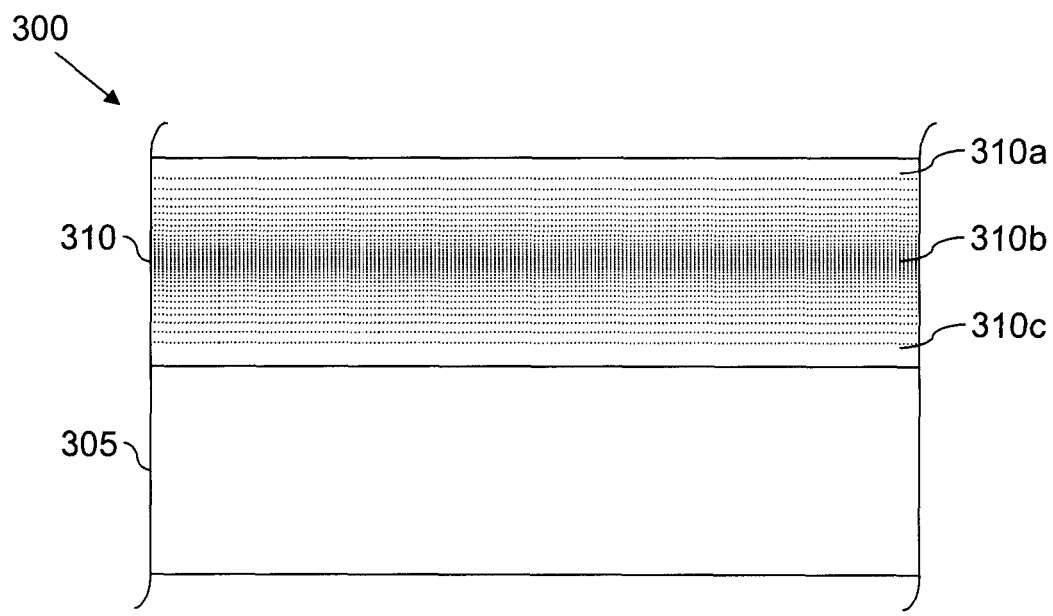
FIG. 2B is a sectional view of at least a portion of an apparatus according to one or more aspects of the present disclosure.

FIG. 2A is at least a portion of a method 200 of manufacturing a gate oxide layer according to one or more aspects of the present disclosure. FIG. 2B is a sectional view of at least a portion of a semiconductor apparatus 300 constructed according to one or more aspects of the method 200 depicted in FIG. 2A.

Referring to FIGS. 2A and 2B, collectively, the method 200 includes a step 210 during which an oxide layer 310 is formed on or over a substrate 305. The substrate 305 may substantially comprise silicon and/or other semiconductors, and may be a silicon-on-insulator (SOI) substrate or other semiconductor-on-insulator substrate. The oxide layer 310 may be grown on the substrate 305, such as by thermal oxidation in a chamber at elevated temperature in an oxidizing environment. Alternatively, or additionally, the oxide layer 310 may be deposited on the substrate 305, such as by chemical-vapor-deposition (CVD) and/or variants thereof.

The method 200 also includes a step 220 during which the oxide layer 310 is subjected to a first nitridation process. For example, the first nitridation process may comprise subjecting the oxide layer 310 to a decoupled plasma nitridation process, perhaps for a duration ranging between about 20 seconds and about 40 seconds, wherein the nitridation power may range between about 0 W and about 100 W. Alternatively, the first nitridation process may comprise subjecting the oxide layer 310 to a thermal nitridation process. The first nitridation process may be performed in an ambient comprising a combination of nitrogen (e.g., $N_2$) and argon or a combination of nitrogen (e.g., $N_2$) and helium, among other nitridation ambient environments within the scope of the present disclosure.

The method 200 also includes a step 230 during which the nitrided-oxide layer 310 is subjected to a first anneal process. For example, the first anneal process may comprise a rapid thermal anneal (RTA), a flash anneal, and/or a laser anneal, among other anneal processes within the scope of the present disclosure. The first anneal process may be performed at a maximum temperature ranging between about 500° C. and about 1000° C., although other temperatures are also within the scope of the present disclosure. The first anneal process may be performed in an ambient comprising a combination of oxygen ($O_2$) and nitrogen ($N_2$), or in pure oxygen, among other annealing ambient environments within the scope of the present disclosure.

The method 200 also includes a step 240 during which the nitrided-annealed-oxide layer 310 is subjected to a second nitridation process. For example, the second nitridation process may comprise subjecting the nitrided and anneal oxide layer 310 to a decoupled plasma nitridation process, perhaps for a duration ranging between about 20 seconds and about 40 seconds, wherein the nitridation power may range between about 50 W and about 2000 W. Alternatively, the second nitridation process may comprise subjecting the nitrided and annealed oxide layer 310 to a thermal nitridation process. The second nitridation process may be performed in an ambient comprising a combination of nitrogen (e.g., $N_2$) and argon or a combination of nitrogen (e.g., $N_2$) and helium, among other nitridation ambient environments within the scope of the present disclosure.

The method 200 also includes a step 250 during which the nitrided-annealed-nitrided-oxide layer 310 is subjected to a second anneal process. For example, the second anneal process may comprise a rapid thermal anneal (RTA), a flash anneal, and/or a laser anneal, among other anneal processes within the scope of the present disclosure. The second anneal process may be performed at a maximum temperature ranging between about 800° C. and about 1100° C., although other temperatures are also within the scope of the present disclosure. The second anneal process may be performed in an ambient comprising a combination of oxygen ($O_2$) and nitrogen ($N_2$), or in pure oxygen, among other annealing ambient environments within the scope of the present disclosure.

In an exemplary embodiment, the first nitridation process of step 220 may comprise subjecting the oxide layer 310 to a decoupled plasma nitridation process for about 40 seconds, the first anneal process of step 230 may comprise subjecting the nitrided oxide layer 310 to a post-nitridation anneal process for about 30 seconds, the second nitridation process of step 240 may comprise subjecting the nitrided and annealed oxide layer 310 to a decoupled plasma nitridation process for about 40 seconds, and the second anneal process of step 250 may comprise subjecting the nitrided, anneal and nitrided oxide layer 310 to a post-nitridation anneal process for about 30 seconds.

In another exemplary embodiment, the first nitridation process of step 220 may comprise subjecting the oxide layer 310 to a decoupled plasma nitridation process for about 40 seconds, the first anneal process of step 230 may comprise subjecting the nitrided oxide layer 310 to a post-nitridation anneal process for about 30 seconds, the second nitridation process of step 240 may comprise subjecting the nitrided and annealed oxide layer 310 to a decoupled plasma nitridation process for about 20 seconds, and the second anneal process of step 250 may comprise subjecting the nitrided, anneal and nitrided oxide layer 310 to a post-nitridation anneal process for about 20 seconds.

In another exemplary embodiment, the first nitridation process of step 220 may comprise subjecting the oxide layer 310 to a decoupled plasma nitridation process for about 40 seconds, the first anneal process of step 230 may comprise subjecting the nitrided oxide layer 310 to a post-nitridation anneal process for about 20 seconds, the second nitridation process of step 240 may comprise subjecting the nitrided and annealed oxide layer 310 to a decoupled plasma nitridation process for about 20 seconds, and the second anneal process of step 250 may comprise subjecting the nitrided, anneal and nitrided oxide layer 310 to a post-nitridation anneal process for about 30 seconds.

In another exemplary embodiment, the first nitridation process of step 220 may comprise subjecting the oxide layer 310 to a decoupled plasma nitridation process for about 40 seconds, the first anneal process of step 230 may comprise subjecting the nitrided oxide layer 310 to a post-nitridation anneal process for about 20 seconds, the second nitridation process of step 240 may comprise subjecting the nitrided and annealed oxide layer 310 to a thermal nitridation process, and the second anneal process of step 250 may comprise subjecting the nitrided, anneal and nitrided oxide layer 310 to a post-nitridation anneal process for about 30 seconds.

In another exemplary embodiment, the first nitridation process of step 220 may comprise subjecting the oxide layer 310 to a thermal nitridation process, the first anneal process of step 230 may comprise subjecting the nitrided oxide layer 310 to a post-nitridation anneal process for about 20 seconds, the second nitridation process of step 240 may comprise subjecting the nitrided and annealed oxide layer 310 to a decoupled plasma nitridation process, and the second anneal process of step 250 may comprise subjecting the nitrided, anneal and nitrided oxide layer 310 to a post-nitridation anneal process for about 30 seconds.

In another exemplary embodiment, the first nitridation process of step 220 may comprise subjecting the oxide layer 310 to a thermal nitridation process, the first anneal process of step 230 may comprise subjecting the nitrided oxide layer 310 to a post-nitridation anneal process for about 20 seconds, the second nitridation process of step 240 may comprise subjecting the nitrided and annealed oxide layer 310 to a thermal nitridation process, and the second anneal process of step 250 may comprise subjecting the nitrided, anneal and nitrided oxide layer 310 to a post-nitridation anneal process for about 30 seconds.

In some embodiments within the scope of the present disclosure, the nitridation power of the first nitridation process of step 220 may be substantially less than the nitridation power of the second nitridation process of step 240. Some embodiments within the scope of the present disclosure may utilize an annealing temperature during the first anneal of step 230 that is substantially less than the annealing temperature utilized during the second anneal of step 250.

The nitrogen dose utilized during the first nitridation process of step 220 may be substantially less than the nitrogen dose utilized during the second nitridation process of step 240. For example, the first nitridation process of step 220 may utilize a nitrogen concentration dosage ranging between about 0% and about 10%, whereas the second nitridation process of step 240 may utilize a nitrogen concentration dosage ranging between about 5% and about 20%, such that the resulting total nitrogen concentration may range between about 5% and about 30%.

In an exemplary embodiment, the temperature utilized to perform the second anneal process of step 250 may be substantially greater than the temperature utilized to perform the first anneal process of step 230, and the duration of the second anneal process of step 250 may be substantially greater than the duration of the first anneal process of step 230. In another exemplary embodiment, the plasma power utilized to perform the first nitridation process of step 220 may be substantially less than the plasma power utilized to perform the second nitridation process of step 240, and the temperature utilized to perform the second anneal process of step 250 may be substantially greater than the temperature utilized to perform the first anneal process of step 230. In such an embodiment, among others within the scope of the present disclosure, the nitrogen dosage of the first nitridation process of step 220 may be substantially less than the nitrogen dosage of the second nitridation process of step 240.

Returning to FIGS. 2A and 2B, the method 200 may include a step 260 during which the nitrided-annealed-nitrided-annealed-oxide layer 310 may be subjected to a third nitridation process. The optional third nitridation process of step 260 may be substantially similar or identical to the first nitridation process of step 220 or the nitridation process of step 240.

The method 200 may also include a step 270 during which the nitrided-annealed-nitrided-annealed-nitrided-oxide layer 310 may be subjected to a third anneal process. The optional third anneal process of step 270 may be substantially similar or identical to the first anneal process of step 230 or the second anneal process of step 250.

As shown in FIG. 2B, the oxide layer 310 processed according to aspects of the method 200 shown in FIG. 2A may have a nitrogen profile in which nitrogen concentration is greatest near the center of the layer 310 and substantially lower near the surfaces of the layer. For example, the middle 310b of the layer 310 may have the highest nitrogen concentration, whereas the top 310a of the layer 310 (near the exposed surface of the layer 310) and the bottom 310c of the layer 310 (near the interface between the layer 310 and the substrate 305) may have little or no nitrogen concentration, or at least substantially reduced nitrogen concentration relative to the middle region 310b of the layer 310.

The above-described aspects of forming a gate oxide layer may be utilized to achieve a gate oxide layer having a nitrogen atomic concentration that is no less than about 16% at the interface between the gate oxide layer and the underlying substrate. The above-described aspects of forming a gate oxide layer may alternatively or additionally be utilized to achieve a gate oxide layer having a ratio of nitrogen concentration beneath the gate electrode to nitrogen concentration at the interface between the gate oxide layer and the underlying substrate that is substantially no less than about 4.5:1.

Figure 3:
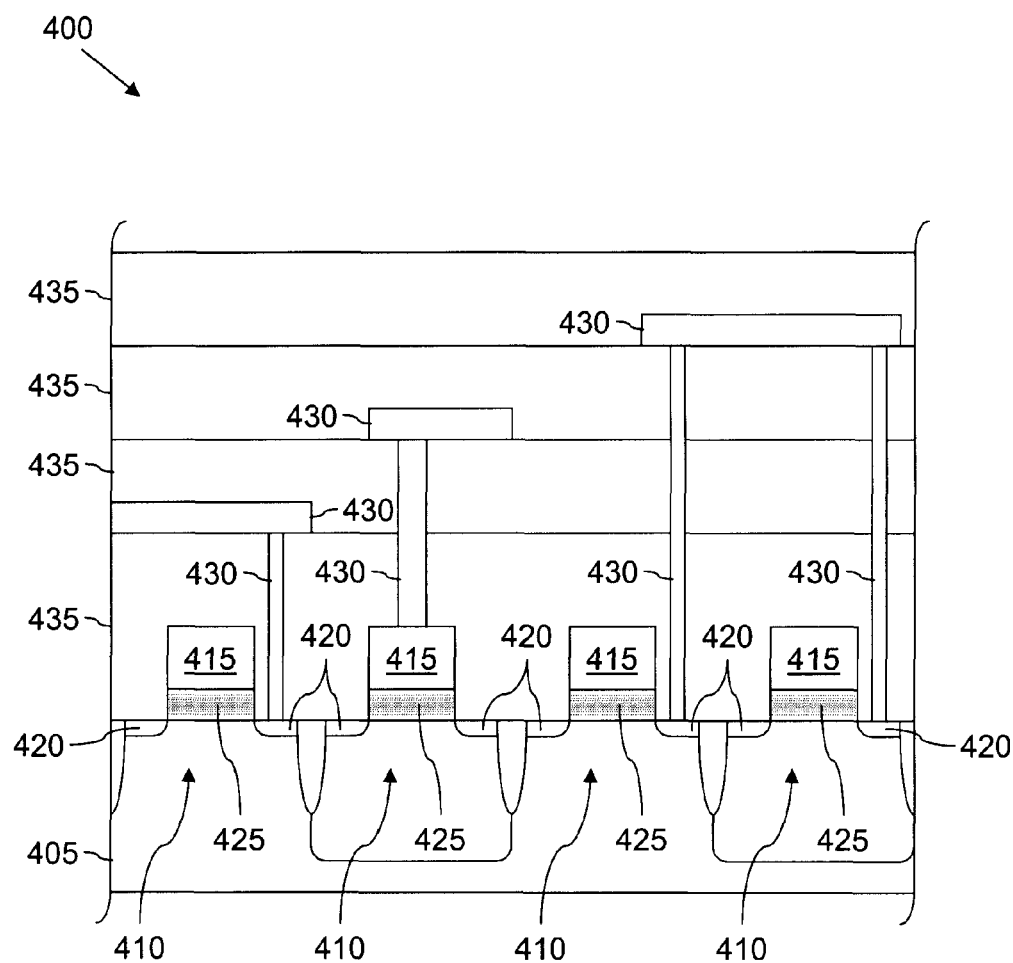
FIG. 3 is a sectional view of at least a portion of an apparatus according to one or more aspects of the present disclosure.

Referring to FIG. 3, illustrated is a sectional view of at least a portion of an apparatus 400 constructed according to one or more aspects of the present disclosure. The apparatus 400 may be or comprise a semiconductor device, and represents one exemplary implementation of the aspects described above with regard to FIGS. 2A and 2B or otherwise within the scope of the present disclosure.

The apparatus 400 includes a substrate 405 and a plurality of CMOS or other devices 410 formed at least partially in the substrate 405. Each of the devices 410 includes a gate electrode 415 and contacts 420. One or more of the devices 410 also include a gate oxide layer 425 substantially similar or identical to the gate oxide layer 310 shown in FIG. 2B or otherwise manufactured according to one or more aspects of the method 200 shown in FIG. 2A.

The apparatus 400 also includes a plurality of horizontal and vertical interconnects 430 contacting the contacts 420 of the devices 410 to interconnect the devices 410 with one another and/or other components of the apparatus 400. The interconnects 430 are electrically isolated from one another, where desired, by one or more of a plurality of insulating layers 435.

To those skilled in the art, it should be apparent from all of the above that the present disclosure introduces a method of manufacturing a semiconductor device comprising forming a gate oxide layer over a substrate, subjecting the gate oxide layer to a first nitridation process, subjecting the gate oxide layer to a first anneal process after the first nitridation process, subjecting the gate oxide layer to a second nitridation process after the first anneal process, subjecting the gate oxide layer to a second anneal process after the second nitridation process, and forming a gate electrode over the gate oxide. The method may further comprise subjecting the gate oxide layer to a third nitridation process after the second anneal process, and subjecting the gate oxide layer to a third anneal process after the third nitridation process. The gate oxide layer may have a thickness ranging between about 10 angstroms and about 20 angstroms. The first nitridation process may utilize a first nitridation power and the second nitridation process may utilize a second nitridation power that is substantially greater than the first nitridation power. For example, the first nitridation process may utilize a first nitridation power ranging between about 0 W and about 100 W and the second nitridation process utilizes a second nitridation power ranging between about 50 W and about 2000 W. The first anneal process may utilize a first temperature and the second anneal process may utilize a second temperature that is substantially greater than the first temperature. For example, the first anneal process may utilize a first temperature ranging between about 500° C. and about 1000° C. and the second anneal process may utilize a second temperature ranging between about 800° C. and about 1100° C. The first anneal process may utilize a first anneal duration and the second anneal process may utilize a second anneal duration that is substantially greater than the first anneal duration. For example, the first anneal process may utilize a first anneal duration of about 20 seconds and the second anneal process may utilize a second anneal duration of about 30 seconds. The first and second nitridation processes may each comprise a decoupled plasma nitridation process and/or a rapid thermal nitridation process. For example, one of the first and second nitridation processes may comprise a decoupled plasma nitridation process and the other of the first and second nitridation processes may comprise a rapid thermal nitridation process. In an exemplary embodiment, the first nitridation process utilizes a first nitridation power ranging between about 0 W and about 100 W, the second nitridation process utilizes a second nitridation power ranging between about 50 W and about 2000 W, the first anneal process utilizes a first temperature ranging between about 500° C. and about 1000° C. and a first anneal duration of about 20 seconds, and the second anneal process utilizes a second temperature ranging between about 800° C. and about 1100° C. and a second anneal duration of about 30 seconds.

The present disclosure also provides a semiconductor apparatus comprising a semiconductor substrate, a gate electrode, and a gate dielectric layer interposing the gate electrode and the semiconductor substrate, wherein the gate dielectric layer has an atomic concentration of nitrogen of at least about 16% at the interface between the gate dielectric layer and the gate electrode. The depth of the interface may be about 16 angstroms. That is, the atomic concentration of nitrogen of at least about 16% may extend into the gate dielectric layer about 16 angstroms from the boundary between the gate dielectric layer and the gate electrode.

The present disclosure also introduces a semiconductor apparatus comprising a semiconductor substrate, a gate electrode, and a gate dielectric layer interposing the gate electrode and the semiconductor substrate, wherein the gate dielectric layer comprises a ratio of at least about 4.5:1 of a first nitrogen concentration at the interface between the gate dielectric layer and the gate electrode to a second nitrogen concentration on at the interface between the gate dielectric layer and the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a semiconductor device, comprising:
   forming a gate oxide layer over a substrate;
   subjecting the gate oxide layer to a first nitridation process;
   subjecting the gate oxide layer to a first anneal process after the first nitridation process;
   subjecting the gate oxide layer to a second nitridation process after the first anneal process;
   subjecting the gate oxide layer to a second anneal process after the second nitridation process; and
   forming a gate electrode over the gate oxide layer; and
   wherein the first and second nitridation processes differ from each other in at least one of process time, nitrogen dosage concentration, and nitridation power.

2. The method of claim 1 further comprising:
   subjecting the gate oxide layer to a third nitridation process after the second anneal process; and
   subjecting the gate oxide layer to a third anneal process after the third nitridation process.

3. The method of claim 1 wherein the gate oxide layer has a thickness ranging between about 10 angstroms and about 20 angstroms.

4. The method of claim 1 wherein the first nitridation process utilizes a first nitridation power ranging between about 0 W and about 100 W and the second nitridation process utilizes a second nitridation power ranging between about 50 W and about 2000 W.

5. The method of claim 1 wherein the first anneal process utilizes a first temperature and the second anneal process utilizes a second temperature that is substantially greater than the first temperature.

6. The method of claim 5 wherein the first nitridation process utilizes a first nitridation power and the second nitridation process utilizes a second nitridation power that is substantially greater than the first nitridation power.

7. The method of claim 1 wherein the first anneal process utilizes a first temperature ranging between about 500° C. and about 1000° C. and the second anneal process utilizes a second temperature ranging between about 800° C. and about 1100° C.

8. The method of claim 7 wherein the first nitridation process utilizes a first nitridation power ranging between about 0 W and about 100 W and the second nitridation process utilizes a second nitridation power ranging between about 50 W and about 2000 W.

9. The method of claim 1 wherein the first anneal process utilizes a first anneal duration and the second anneal process utilizes a second anneal duration that is substantially greater than the first anneal duration.

10. The method of claim 9 wherein the first nitridation process utilizes a first nitridation power and the second nitridation process utilizes a second nitridation power that is substantially greater than the first nitridation power.

11. The method of claim 1 wherein the first anneal process utilizes a first anneal duration of about 20 seconds and the second anneal process utilizes a second anneal duration of about 30 seconds.

12. The method of claim 11 wherein the first nitridation process utilizes a first nitridation power and the second nitridation process utilizes a second nitridation power that is substantially greater than the first nitridation power.

13. The method of claim 12 wherein the first anneal process utilizes a first temperature and the second anneal process utilizes a second temperature that is substantially greater than the first temperature.

14. The method of claim 1 wherein the first and second nitridation processes each comprise a decoupled plasma nitridation process.

15. The method of claim 1 wherein the first and second nitridation processes each comprise a rapid thermal nitridation process.

16. The method of claim 1 wherein one of the first and second nitridation processes comprises a decoupled plasma nitridation process and the other of the first and second nitridation processes comprises a rapid thermal nitridation process.

17. A semiconductor apparatus, comprising:
   a semiconductor substrate;
   a gate electrode; and
   a gate dielectric layer interposing the gate electrode and the semiconductor substrate, wherein the gate dielectric layer has an atomic concentration of nitrogen of at least about 16% at the interface between the gate dielectric layer and the gate electrode and wherein a nitrogen concentration of a center layer of the gate dielectric layer is higher than the first and second nitrogen concentrations.

18. The apparatus of claim 17 wherein the depth of the interface is about 16 angstroms.

19. A semiconductor apparatus, comprising:
   a semiconductor substrate;
   a gate electrode; and
   a gate dielectric layer having a thickness of about 10 to about 20 angstroms and interposing the gate electrode and the semiconductor substrate, wherein the gate dielectric layer comprises a ratio of at least about 4.5:1 of a first nitrogen concentration at the interface between the gate dielectric layer and the gate electrode to a second nitrogen concentration on at the interface between the gate dielectric layer and the semiconductor substrate.

20. The method of claim 1, wherein the nitrogen dose concentration of the first nitridation process is about 0% to about 10% and the nitrogen dose concentration of the second nitridation process is about 5% to about 20%.

21. The method of claim 1, wherein the total nitrogen concentration in the gate oxide is between about 5% and about 30% and wherein a first nitrogen concentration at the interface between the gate oxide layer and the gate electrode and a second nitrogen concentration at the interface between the gate oxide layer and the substrate are not the same.

22. The method of claim 1, wherein at least one of the process time, nitrogen dosage concentration, and nitridation power of the second nitridation process is greater than the process time, nitrogen dosage concentration, and nitridation power of the first nitridation process.

23. The method of claim 1, wherein the gate dielectric layer comprises a ratio of at least about 4.5:1 of a first nitrogen concentration at the interface between the gate dielectric layer and the gate electrode to a second nitrogen concentration on at the interface between the gate dielectric layer.

* * * * *